(12) United States Patent
Yoneda et al.

(10) Patent No.: US 9,871,984 B2
(45) Date of Patent: Jan. 16, 2018

(54) IMAGING DEVICE, CONTROL METHOD OF IMAGING DEVICE, AND PIXEL STRUCTURE

(71) Applicant: RICOH COMPANY, LTD., Tokyo (JP)

(72) Inventors: Kazuhiro Yoneda, Tokyo (JP); Hirofumi Watanabe, Tokyo (JP); Takaaki Negoro, Tokyo (JP); Katsuhiko Aisu, Tokyo (JP); Yasukazu Nakatani, Tokyo (JP); Katsuyuki Sakurano, Tokyo (JP)

(73) Assignee: RICOH COMPANY, LTD., Tokyo (JP)

( * ) Notice: Subject to any disclaimer, the term of this patent is extended or adjusted under 35 U.S.C. 154(b) by 131 days.

(21) Appl. No.: 14/788,991

(22) Filed: Jul. 1, 2015

(65) Prior Publication Data
US 2016/0027835 A1   Jan. 28, 2016

(30) Foreign Application Priority Data

Jul. 23, 2014   (JP) .................................. 2014-149445

(51) Int. Cl.
*H04N 5/369* (2011.01)
*H01L 27/146* (2006.01)

(52) U.S. Cl.
CPC ......... *H04N 5/369* (2013.01); *H01L 27/1461* (2013.01); *H01L 27/1463* (2013.01); *H01L 27/14603* (2013.01); *H01L 27/14612* (2013.01); *H01L 27/14638* (2013.01); *H01L 27/14643* (2013.01)

(58) Field of Classification Search
CPC .... H01L 27/146–27/14893; H01L 31/022408; H01L 31/1105; H04N 5/30–5/378
See application file for complete search history.

(56) References Cited

U.S. PATENT DOCUMENTS

| | | |
|---|---|---|
| 5,227,793 A | 7/1993 | Aisu |
| 5,656,841 A | 8/1997 | Watanabe et al. |
| 5,825,673 A | 10/1998 | Watanabe |
| 6,075,404 A | 6/2000 | Shindoh et al. |
| 6,271,730 B1 | 8/2001 | Abe et al. |
| 6,278,322 B1 | 8/2001 | Aisu et al. |
| 6,437,550 B2 | 8/2002 | Andoh et al. |
| 6,876,251 B2 | 4/2005 | Watanabe |
| 6,894,350 B2 | 5/2005 | Shimizu et al. |
| 6,911,694 B2 | 6/2005 | Negoro et al. |
| 6,921,199 B2 | 7/2005 | Aota et al. |
| 7,078,954 B2 | 7/2006 | Watanabe |
| 7,242,059 B2 | 7/2007 | Negoro et al. |

(Continued)

FOREIGN PATENT DOCUMENTS

JP   2013-187527   9/2013

*Primary Examiner* — Paul Berardesca
(74) *Attorney, Agent, or Firm* — Cooper & Dunham LLP

(57) ABSTRACT

An imaging device having phototransistors in photodetectors of pixels is disclosed. The imaging device includes an implanted electrode configured to separate the pixels, a first emitter disposed at a position adjacent to the implanted electrode, and a second emitter disposed such that a distance from the implanted electrode to the second emitter is longer than a distance from the implanted electrode to the first emitter.

14 Claims, 3 Drawing Sheets

(56) References Cited

U.S. PATENT DOCUMENTS

| | | |
|---|---|---|
| 7,262,447 B2 | 8/2007 | Negoro et al. |
| 7,335,967 B2 | 2/2008 | Watanabe |
| 7,368,715 B2 | 5/2008 | Watanabe |
| 7,381,066 B2 | 6/2008 | Higashiguchi et al. |
| 7,382,187 B2 | 6/2008 | Aisu |
| 7,394,307 B2 | 7/2008 | Negoro et al. |
| 7,425,753 B2 | 9/2008 | Kato et al. |
| 7,426,146 B2 | 9/2008 | Aota et al. |
| 7,474,145 B2 | 1/2009 | Negoro |
| 7,646,242 B2 | 1/2010 | Negoro |
| 7,675,951 B2 | 3/2010 | Nakatani |
| 7,694,886 B2 | 4/2010 | Tan et al. |
| 7,719,242 B2 | 5/2010 | Negoro |
| 7,735,375 B2 | 6/2010 | Ueda et al. |
| 7,755,337 B2 | 7/2010 | Negoro |
| 7,773,491 B2 | 8/2010 | Nakatani |
| 8,169,039 B2 | 5/2012 | Negoro |
| 8,174,319 B2 | 5/2012 | Aota et al. |
| 8,378,747 B2 | 2/2013 | Aisu |
| 8,531,237 B2 | 9/2013 | Aisu |
| 8,759,772 B2 | 6/2014 | Noguchi et al. |
| 8,772,722 B2 | 7/2014 | Noguchi et al. |
| 8,878,599 B2 | 11/2014 | Negoro |
| 8,969,810 B2 | 3/2015 | Nagahisa et al. |
| 8,975,939 B2 | 3/2015 | Negoro et al. |
| 9,059,065 B2 | 6/2015 | Hayashi et al. |
| 2006/0152284 A1 | 7/2006 | Morino |
| 2006/0197581 A1 | 9/2006 | Chun et al. |
| 2007/0109039 A1 | 5/2007 | Watanabe |
| 2011/0185326 A1 | 7/2011 | Ueda et al. |
| 2013/0127504 A1 | 5/2013 | Hayashi et al. |
| 2013/0187030 A1 | 7/2013 | Hayashi et al. |
| 2013/0234277 A1* | 9/2013 | Negoro ............. H01L 27/14681 257/443 |
| 2014/0239158 A1 | 8/2014 | Hayashi et al. |
| 2014/0367550 A1 | 12/2014 | Aisu et al. |
| 2015/0070546 A1 | 3/2015 | Negoro et al. |
| 2015/0076572 A1 | 3/2015 | Sakurano et al. |
| 2015/0214413 A1* | 7/2015 | Negoro ............. H01L 31/02019 257/448 |

\* cited by examiner

US 9,871,984 B2

IMAGING DEVICE, CONTROL METHOD OF IMAGING DEVICE, AND PIXEL STRUCTURE

BACKGROUND OF THE INVENTION

1. Field of the Invention

The disclosures discussed herein relate to an imaging device, a control method of the imaging device, and a pixel structure.

2. Description of the Related Art

There are disclosed solid-state imaging devices having improved sensitivity known in the art. Such solid-state imaging devices employ phototransistors configured to amplify an optical current to output the amplified optical current, thereby serving as a photoelectric converters. The solid-state imaging devices having the above-described phototransistors have residual electric charges remaining in a base. The residual electric charges are obtained by reset operations after the output of the amplified optical current. The solid-state imaging devices may thus be able to improve their sensitivity by discharging the residual electric charges remaining in the base (accumulated electric charges in the base that have not been completely discharged when reading).

For example, Japanese Laid-open Patent Publication No. 2013-187527 (hereinafter referred to as "Patent Document 1") discloses an imaging device with a reduced size and improved light utilization efficiency. The imaging device disclosed in Patent Document 1 includes implanted electrodes insulated by an oxide film to separate pixels. Hence, the imaging device increases optical current amplification by applying a voltage to the implanted electrodes to thereby achieve the reduction in size and the improved light utilization efficiency.

However, the related art solid-state imaging devices have the optical current amplified by the application of the voltage to the implanted electrodes when reading signals, which may increase a time to discharge residual electric charges when resetting relative to the amplification of the optical current when reading.

RELATED ART DOCUMENT

Patent Document

Patent Document 1
Japanese Laid-open Patent Publication No. 2013-187527

SUMMARY OF THE INVENTION

Accordingly, it is a general object in one embodiment of the present invention to provide an imaging device, a control method of the imaging device, and a pixel structure capable of reducing a reset time that substantially obviate one or more problems caused by the limitations and disadvantages of the related art.

According to an aspect of embodiments, there is disclosed an imaging device having phototransistors in photodetectors of pixels. The imaging device includes an implanted electrode configured to separate the pixels; a first emitter disposed at a position adjacent to the implanted electrode; and a second emitter disposed such that a distance from the implanted electrode to the second emitter is longer than a distance from the implanted electrode to the first emitter.

Other objects, features and advantages of the present invention will become more apparent from the following detailed description when read in conjunction with the accompanying drawings.

DETAILED DESCRIPTION OF THE PREFERRED EMBODIMENTS

Figure 1:
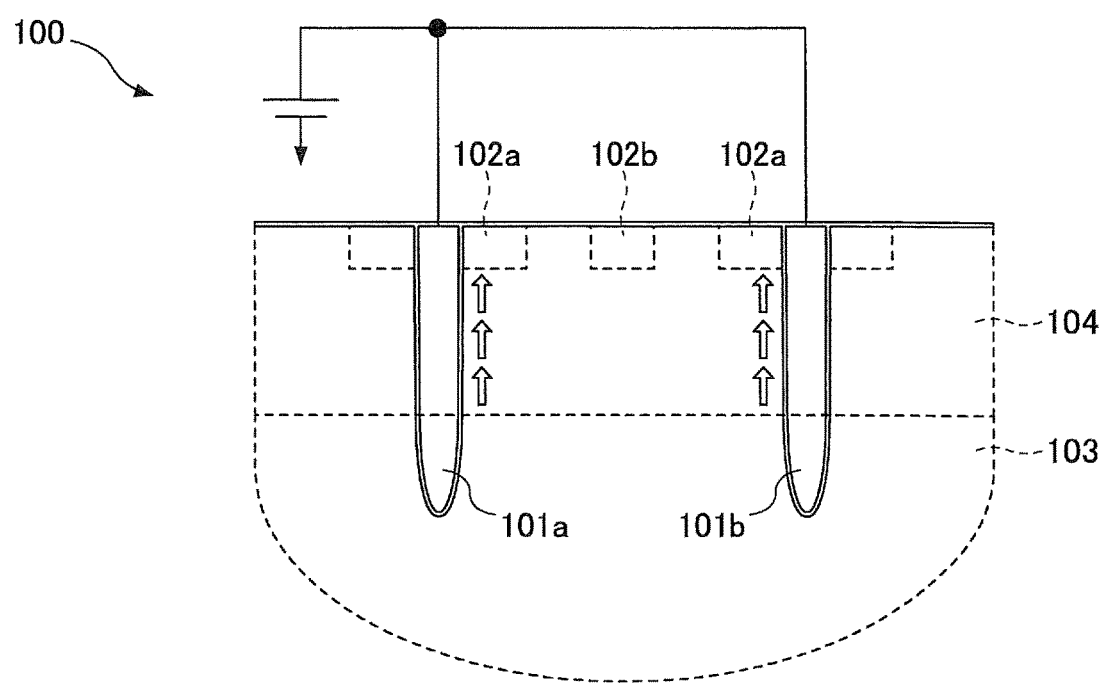
FIG. 1 is a diagram illustrating an example of an imaging device according to an embodiment.

In the following, a description is given of an embodiment of the present invention with reference to accompanying drawings. In the drawings, identical components are provided with the same reference numbers to omit duplicated illustrations.

Configuration of Imaging Device

Figure 2A:
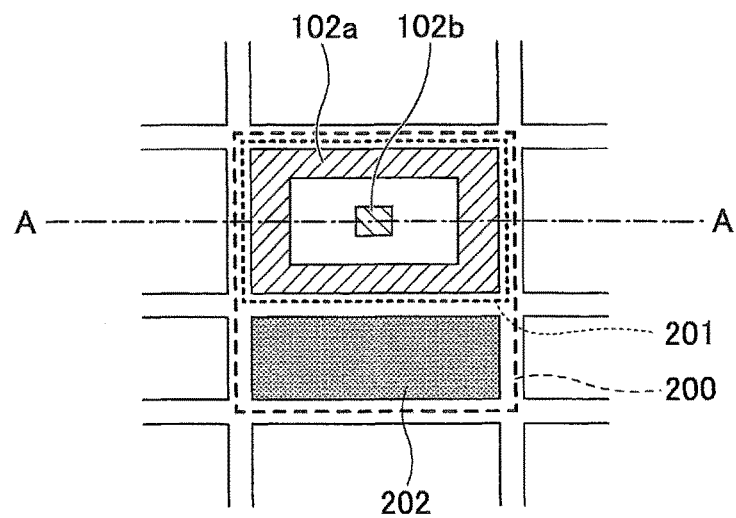
FIGS. 2A and 2B are diagrams illustrating an example of the imaging device according to an embodiment.
Figure 2B:
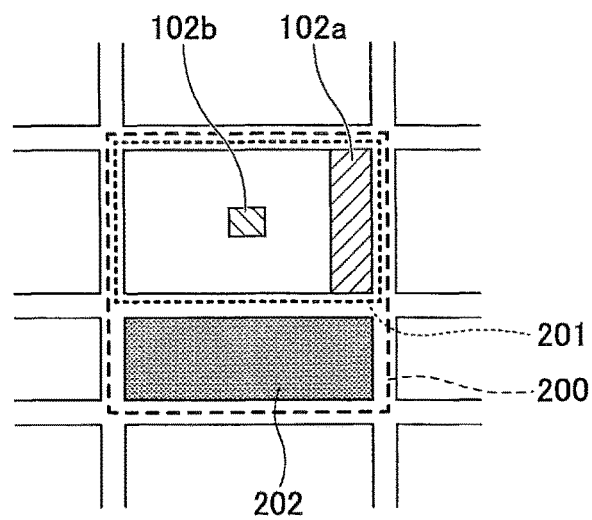

FIG. 1, and FIGS. 2A and 2B illustrate examples of an imaging device according to an embodiment. FIG. 1 is a cross-sectional diagram cut along a broken line A-A illustrated in FIG. 2A.

An imaging device (a solid-state imaging device) 100 includes pixels in an array. Each pixel has a photodetector 201 and a transistor part 202, and the photodetector 201 has a phototransistor. The phototransistor includes implanted electrodes 101 (101a and 101b), a first emitter 102a (an output emitter), a second emitter 102b (a discharge emitter), a collector 103, and a base 104. The imaging device 100 may be able to take an image with high sensitivity by utilizing the phototransistor amplification effect. The phototransistor amplification effect is generated in an electrode surface by the application of a voltage to the implanted electrodes 101 (101a and 101b).

The implanted electrodes (trenches) 101 are formed such that the implanted electrodes 101 surround the pixels and penetrate the first emitter 102a and the base 104 to separate the pixels. Further, the implanted electrodes 101 are formed such that the implanted electrodes 101 surround the photodetector 201 and the transistor part 202, respectively, to separate the photodetector 201 and the transistor part 202 (see FIGS. 2A and 2B).

The collector 103 is formed in a deep area of a semiconductor layer, and the base 104 is formed in a shallow area of the semiconductor layer. The collector 103 and the base 104 are formed in contact with each other. The emitters 102 (102a and 102b) are formed in a shallow area of the base 104, and the base 104 and the emitters 102 are formed in contact with one another.

The first emitter 102a is formed adjacent to the implanted electrodes 101. The second emitter 102b is surrounded by the first emitter 102a, and disposed in the center of the photodetector 201 (see FIG. 2A). Note that the second emitter 102b is not necessarily surrounded by the first emitter 102a. For example, the first emitter 102a may be formed adjacent only to one side of the implanted electrode 101 that surrounds the photodetector 201, and the second emitter 102b is disposed in the center of the photodetector 201 (see FIG. 2B). The second emitter 102b may at least be disposed at a position having a distance farther from the implanted electrode 101 than the position at which the first emitter 102a is disposed.

The phototransistor includes a multi-emitter structure in which the collector 103 is shared between all the pixels, and each of the pixels has two emitters 102. Detailed illustration of the phototransistor is given later. However, the phototransistor is configured to output, when reading, from the first emitter 102a the optical current amplified at a surface of the implanted electrode 101, and configured to discharge, when resetting, from the second emitter 102b the residual electric charges remaining in the base 104. That is, the imaging device 100 utilizes the first emitter 102a exhibiting increased current amplification when reading, and utilizes the second emitter 102b exhibiting stable (unchanging) current amplification when resetting. Hence, the imaging device 100 may be able to shorten the discharge time when resetting despite the fact that the optical current is amplified when reading.

Note that the current amplification of the phototransistor is determined based on a distance (i.e., a width of the base 104) from a junction capacitance between the collector 103 and the base 104 to a junction capacitance between the base 104 and the emitter 102. The current amplification of the phototransistor increases as the width of the base 104 decreases. Further, the current amplification of the phototransistor may be determined based on the impurity concentration of the emitter 102, the impurity concentration of the collector 103, the impurity concentration of the base 104, the voltage between the collector 103 and the emitter 102, and the like, in addition to the width of the base 104.

Note that an illustration is given of the amplification effect of the implanted electrodes. When a voltage (e.g., a positive voltage) is applied to the implanted electrode 101, electrons gather in the surfaces of the implanted electrodes 101 (see upwards thick Arrows in FIG. 1), and the electrons present near the implanted electrode 101 surfaces and the positive holes present in the base 104 are recoupled. Accordingly, an electrically neutral area is formed in the surfaces of the implanted electrodes 101 to shorten the width of the base 104. The current amplification near the electrode 101 surfaces increases as the optical current preferentially flows near the surfaces of the electrodes 101, which may further increase the current amplification of the phototransistor.

By contrast, when no voltage is applied to the implanted electrode, the current amplification does not change in the surfaces of the implanted electrodes 101. Hence, the optical current flows from the collector 103 to the emitters 102 in an entire surface of the phototransistor.

That is, the application of a voltage to the implanted electrodes 101 may increase the current amplification (e.g. several hundreds×hFE times) of the first emitter 102a adjacent to the implanted electrode 101 higher than the current amplification (e.g. hFE times) of the second emitter 102b. Accordingly, the imaging device 100 may be able to perform imaging with high sensitivity by utilizing the voltage applied to the implanted electrodes 101.

Output Emitter (First Emitter) and Discharge Emitter (Second Emitter)

Next, an illustration is given of the amplification of the optical current when reading and the reduction in the discharge time when resetting for performing high sensitivity imaging by applying the voltage to the implanted electrodes 101 by using the output emitter (first emitter) and the discharge emitter (second emitter). The current amplification of the phototransistor is represented by hFE.

Each of the first emitter 102a and the second emitter 102b is connected to not-illustrated wiring of the transistor part 202. Whether to output or not to output the optical current from the first emitter 102a, or whether to discharge or not to discharge the residual electric charges from the second emitter 102b is controlled based on an on or off of the transistors disposed on the transistor part 202.

For example, when reading, a transistor connected to the first emitter 102a is turned on and a transistor connected to the second emitter 102b is turned off. That is, when reading, the imaging device 100 utilizes only the first emitter 102a exhibiting the high current amplification. The imaging device 100 is provided with the amplification effect generated in the surfaces of the implanted electrodes 101 of the phototransistor, and capable of amplifying the optical current by (hFE) to (several hundreds×hFE) times to output the amplified optical current.

Further, when resetting, the transistor connected to the first emitter 102a is turned off and the transistor connected to the second emitter 102b is turned on. That is, when resetting, the imaging device 100 utilizes only the second emitter 102b exhibiting no current amplification change. The imaging device 100 is not provided with the amplification effect generated in the implanted electrode 101 surfaces of the phototransistor, and is hence capable of discharging the residual electric charges remaining in the base 104 at a (1/hFE) times speed. Hence, the imaging device 100 is capable of reducing the discharge time. Note that the residual electric charges remaining in the base 104 are uniquely determined based on the electric potential or resistance of a circuit; however, the imaging device 100 may be able to reduce the discharge time regardless of the quantity of the residual electric charges.

The imaging device 100 according to the embodiment includes the two emitters having different current amplifications in the phototransistor to switch the two emitters between reading and resetting. This configuration enables the imaging device 100 to perform high sensitivity imaging and reduce a resetting time, simultaneously. Further, the imaging device 100 may expand a dynamic range as well as maintaining high sensitivity by switching between the emitters in use based on imaging subjects.

Related Art Phototransistor Structure

Figure 3:
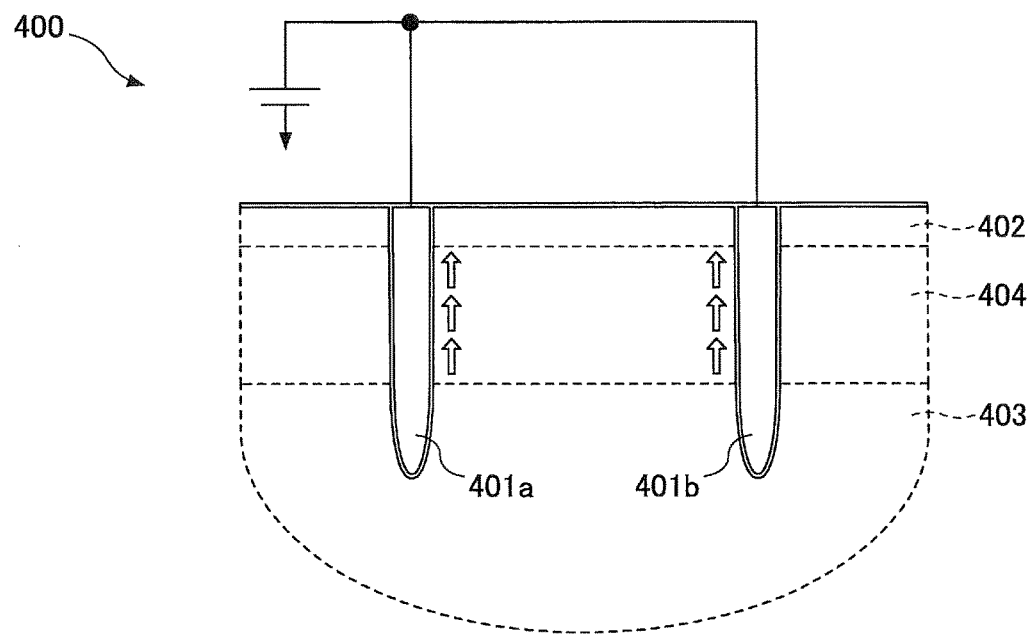
FIG. 3 is a diagram illustrating a related art imaging device.
Figure 4:
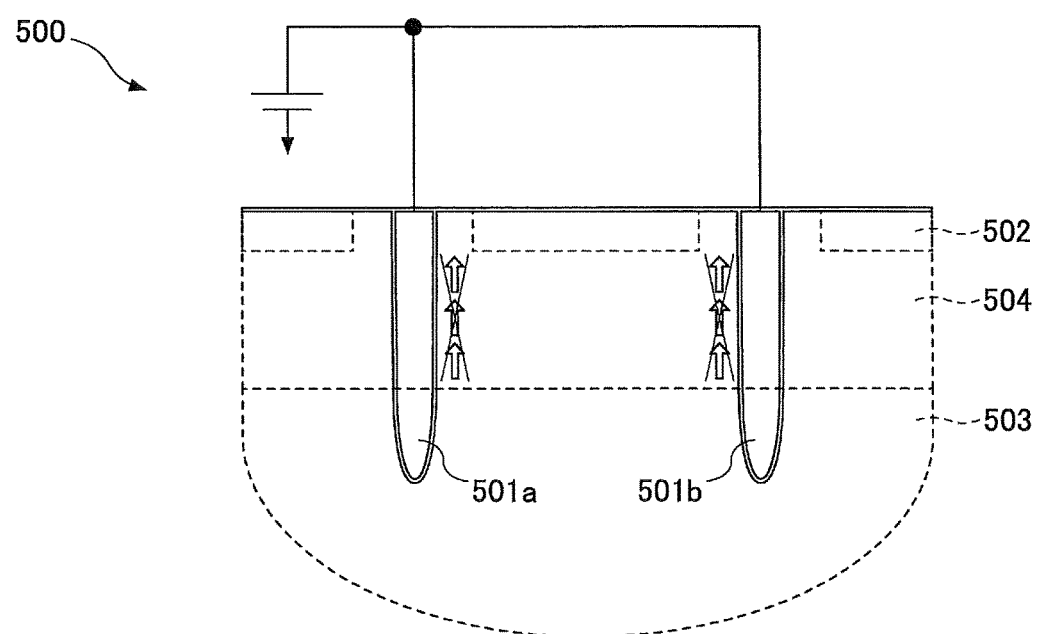
FIG. 4 is a diagram illustrating a related art imaging device.

FIG. 3 illustrates an imaging device 400 having a phototransistor of a related art structure, and FIG. 4 illustrates an imaging device 500 having a phototransistor of a related art structure.

The imaging device 400 includes implanted electrodes 401 (401a and 401b), an emitter 402, a collector 403, a base 404, and the like.

As illustrated in FIG. 3, the imaging device 400 includes the emitter 402 formed in an entire surface of the phototransistor. In this case, when reading, the imaging device 400 is provided with an amplification effect generated in surfaces of an implanted electrodes 401, and capable of amplifying an optical current by (hFE) to (several hundreds×hFE) times to output the amplified optical current. However, when resetting, the imaging device 400 discharges the residual electric charges at a (1/several hundreds×hFE) times speed, and hence the discharge time is extremely long.

Accordingly, it appears difficult to reduce the reset time in the imaging device 400 having the structure illustrated in FIG. 3.

The imaging device 500 includes implanted electrodes 501 (501a and 501b), an emitter 502, a collector 503, a base 504, and the like.

As illustrated in FIG. 4, in the imaging device 500, the emitter 502 is not formed on surfaces of the implanted electrodes 501. In this case, the residual electric charges are discharged at a (1/hFE) times speed when resetting, indicating that the imaging device 500 may reduce the discharge time compared to the discharge time in the imaging device 400 illustrated in FIG. 3. However, the imaging device 500 merely includes a current path between the collector 503, the base 504, and the emitter 502 when reading. Hence, the imaging device 500 may fail to amplify the optical current by (hFE) to (1/several hundreds×hFE) times. Accordingly, it appears difficult for the imaging device 500 having the structure illustrated in FIG. 4 to perform high sensitivity imaging.

The imaging device 100 according to the embodiment may be combined with the phototransistor structure illustrated in FIG. 3 or the phototransistor structure illustrated in FIG. 4 to reduce the reset time while performing high sensitivity imaging. That is, the imaging device 100 according to the embodiment having a pixel structure capable of having benefit alone may be obtained by appropriately switching between the emitters to utilize the amplification effect generated by the application of the voltage to the implanted electrodes merely when reading, and not to utilize such amplification effect when resetting.

The imaging device 100 according to the embodiment may be able to reduce the reset time.

The embodiments of the present invention are described above. However, the present invention is not limited to the specifically disclosed embodiments, and variations and modifications may be made without departing from the gist of the embodiment recited in the scope of the present invention.

The present invention is not limited to the specifically disclosed embodiments, and variations and modifications may be made without departing from the scope of the present invention.

The present application is based on and claims the benefit of priority of Japanese Priority Application No. 2014-149445 filed on Jul. 23, 2014, the entire contents of which are hereby incorporated herein by reference.

What is claimed is:

1. An imaging device having phototransistors in photodetectors of pixels, the imaging device comprising:
   an implanted electrode configured to separate the pixels;
   a first emitter disposed at a position adjacent to the implanted electrode; and
   a second emitter disposed such that a distance from the implanted electrode to the second emitter is longer than a distance from the implanted electrode to the first emitter,
   wherein the second emitter is surrounded by the first emitter.

2. The imaging device as claimed in claim 1, wherein current amplification of the first emitter is higher than that of the second emitter.

3. An imaging device having phototransistors in photodetectors of pixels, the imaging device comprising:
   an implanted electrode configured to separate the pixels;
   a first emitter disposed at a position adjacent to the implanted electrode; and
   a second emitter disposed such that a distance from the implanted electrode to the second emitter is longer than a distance from the implanted electrode to the first emitter,
   wherein in a case where a voltage is applied to the implanted electrode, the first emitter outputs an optical current amplified in a surface of the implanted electrode when reading, and the second emitter discharges electric residual charges remaining in a base when resetting.

4. The imaging device as claimed in claim 3, wherein
   when reading, the transistor connected to the first emitter via wiring is turned on, and the transistor connected to the second emitter via wiring is turned off, and
   when resetting, the transistor connected to the first emitter via wiring is turned off, and the transistor connected to the second emitter via wiring is turned on.

5. The imaging device as claimed in claim 3, wherein current amplification of the first emitter is higher than that of the second emitter.

6. The imaging device as claimed in claim 1, wherein
   in a case where a voltage is applied to the implanted electrode, the first emitter outputs an optical current amplified in a surface of the implanted electrode when reading, and the second emitter discharges electric residual charges remaining in a base when resetting.

7. The imaging device as claimed in claim 1, wherein current amplification of the first emitter is higher than that of the second emitter, and wherein
   in a case where a voltage is applied to the implanted electrode, the first emitter outputs an optical current amplified in a surface of the implanted electrode when reading, and the second emitter discharges electric residual charges remaining in a base when resetting.

8. The imaging device as claimed in claim 3, wherein the second emitter is surrounded by the first emitter.

9. The imaging device as claimed in claim 1, wherein
   in a case where a voltage is applied to the implanted electrode, the first emitter outputs an optical current amplified in a surface of the implanted electrode when reading, and the second emitter discharges electric residual charges remaining in a base when resetting, and wherein
   when reading, the transistor connected to the first emitter via wiring is turned on, and the transistor connected to the second emitter via wiring is turned off, and
   when resetting, the transistor connected to the first emitter via wiring is turned off, and the transistor connected to the second emitter via wiring is turned on.

10. The imaging device as claimed in claim 1, wherein current amplification of the first emitter is higher than that of the second emitter, wherein
    in a case where a voltage is applied to the implanted electrode, the first emitter outputs an optical current amplified in a surface of the implanted electrode when reading, and the second emitter discharges electric residual charges remaining in a base when resetting, and wherein
    when reading, the transistor connected to the first emitter via wiring is turned on, and the transistor connected to the second emitter via wiring is turned off, and
    when resetting, the transistor connected to the first emitter via wiring is turned off, and the transistor connected to the second emitter via wiring is turned on.

11. The imaging device as claimed in claim 3, wherein the second emitter is surrounded by the first emitter, current amplification of the first emitter is higher than that of the second emitter,
    when reading, the transistor connected to the first emitter via wiring is turned on, and the transistor connected to the second emitter via wiring is turned off, and when resetting, the transistor connected to the first emitter via wiring is turned off, and the transistor connected to the second emitter via wiring is turned on.

12. A method of controlling an imaging device, the imaging device having phototransistors in photodetectors of pixels, each of the phototransistors having an implanted electrode configured to separate the pixels, a first emitter disposed adjacent to the implanted electrode, and a second emitter disposed such that a distance from the implanted electrode to the second emitter is longer than a distance from the implanted electrode to the first emitter, the method comprising:

in a case where a voltage is applied to the implanted electrode, turning the transistor connected to the first emitter via wiring on and turning the transistor connected to the second emitter via wiring off such that the first emitter outputs an optical current amplified in a surface of the implanted electrode when reading; and turning the transistor connected to the first emitter via wiring off and turning the transistor connected to the second emitter via wiring on such that the second emitter discharges electric residual charges remaining in a base when resetting.

13. The method as claimed in claim 12, wherein the first and the second emitters to be used are switched based on a subject to be imaged.

14. The imaging device as claimed in claim 1, wherein the pixel structure of the imaging device comprises:

the implanted electrode configured to separate the pixels;

the first emitter disposed adjacent to the implanted electrode; and the second emitter disposed such that a distance from the implanted electrode to the second emitter is longer than a distance from the implanted electrode to the first emitter.

* * * * *

UNITED STATES PATENT AND TRADEMARK OFFICE
CERTIFICATE OF CORRECTION

| | | |
|---|---|---|
| PATENT NO. | : 9,871,984 B2 | Page 1 of 1 |
| APPLICATION NO. | : 14/788991 | |
| DATED | : January 16, 2018 | |
| INVENTOR(S) | : Kazuhiro Yoneda et al. | |

It is certified that error appears in the above-identified patent and that said Letters Patent is hereby corrected as shown below:

On the Title Page

Replace item (71) with the following:
-- (71) Applicant: Kazuhiro Yoneda, Osaka (JP);
Hirofumi Watanabe, Hyogo (JP);
Takaaki Negoro, Osaka (JP);
Katsuhiko Aisu, Hyogo (JP);
Yasukazu Nakatani, Hyogo (JP);
Katsuyuki Sakurano, Hyogo (JP). --

Replace item (72) with the following:
-- (72) Inventors: Kazuhiro Yoneda, Osaka (JP);
Hirofumi Watanabe, Hyogo (JP);
Takaaki Negoro, Osaka (JP);
Katsuhiko Aisu, Hyogo (JP);
Yasukazu Nakatani, Hyogo (JP);
Katsuyuki Sakurano, Hyogo (JP). --

Signed and Sealed this
Twenty-sixth Day of June, 2018

Andrei Iancu
*Director of the United States Patent and Trademark Office*